(12) United States Patent
Kajihara et al.

(10) Patent No.: US 11,094,298 B2
(45) Date of Patent: Aug. 17, 2021

(54) CAPO

(71) Applicants: Gotoh Gut Co., Ltd., Isesaki (JP);
Gunma Prefecture, Maebashi (JP)

(72) Inventors: Atsushi Kajihara, Maebashi (JP);
Masaki Gotoh, Isesaki (JP); Osamu Niijima, Tomioka (JP); Hiroshi Miyajima, Yokohama (JP)

(73) Assignees: GOTOH GUT CO., LTD., Isesaki (JP); GUNMA PREFECTURE, Maebashi (JP)

( * ) Notice: Subject to any disclaimer, the term of this patent is extended or adjusted under 35 U.S.C. 154(b) by 0 days.

(21) Appl. No.: 16/878,893

(22) Filed: May 20, 2020

(65) Prior Publication Data
US 2020/0279543 A1 Sep. 3, 2020

Related U.S. Application Data

(63) Continuation of application No. PCT/JP2018/043432, filed on Nov. 26, 2018.

(30) Foreign Application Priority Data

Nov. 27, 2017 (JP) .............................. JP2017-226676

(51) Int. Cl.
| G10D 3/053 | (2020.01) |
| H02K 11/27 | (2016.01) |
| G01R 19/165 | (2006.01) |
| H02K 7/116 | (2006.01) |

(52) U.S. Cl.
CPC ....... *G10D 3/053* (2020.02); *G01R 19/16542* (2013.01); *H02K 7/1166* (2013.01); *H02K 11/27* (2016.01)

(58) Field of Classification Search
CPC ...... G10D 3/053; H02K 11/27; H02K 7/1166; G01R 19/16542
See application file for complete search history.

(56) References Cited

U.S. PATENT DOCUMENTS

| 3,837,255 A | 9/1974 | Starns et al. |
| 6,726,194 B2* | 4/2004 | Migliori ............... B25B 5/12 269/225 |
| 10,312,653 B2* | 6/2019 | Ballard ............. H01R 43/0427 |
| 2010/0154616 A1 | 6/2010 | Campling |

(Continued)

FOREIGN PATENT DOCUMENTS

| GB | 460251 A | 1/1937 |
| GB | 2111286 A | 6/1983 |

(Continued)

OTHER PUBLICATIONS

International Search Report for PCT/JP2018/043432 dated Feb. 5, 2019.

(Continued)

*Primary Examiner* — Jianchun Qin
(74) *Attorney, Agent, or Firm* — Birch, Stewart, Kolasch & Birch, LLP (57) ABSTRACT

Provided is a capo that can be operated simply and reliably. A capo includes a pair of arm members (a first arm member and a second arm member) capable of sandwiching a neck, and an electric drive mechanism that changes a distance between the pair of arm members.

7 Claims, 8 Drawing Sheets

(56) References Cited

U.S. PATENT DOCUMENTS

2011/0023683 A1    2/2011  Vochezer
2011/0036229 A1*  2/2011  Chen .................. G10D 3/053
                                                    84/318
2015/0000502 A1    1/2015  Rozendaal

FOREIGN PATENT DOCUMENTS

| JP | 2-138795 U | 11/1990 |
| JP | 6-35447 A | 2/1994 |
| JP | 2010-145998 A | 7/2010 |
| WO | WO 98/49669 A1 | 11/1998 |
| WO | WO 2009/115461 A1 | 9/2009 |

OTHER PUBLICATIONS

Written Opinion of the International Searching Authority for PCT/JP2018/043432 dated Feb. 5, 2019.
Extended European Search Report, dated Dec. 2, 2020, for European Application No. 18882176.3.

* cited by examiner

CAPO

CROSS-REFERENCE TO RELATED APPLICATIONS

The present application is a Continuation of PCT International Application No. PCT/JP2018/043432 filed on Nov. 26, 2018 claiming priority under 35 U.S.C § 119(a) to Japanese Patent Application No. 2017-226676 filed on Nov. 27, 2017. Each of the above applications is hereby expressly incorporated by reference, in its entirety, into the present application.

BACKGROUND OF THE INVENTION

1. Field of the Invention

The present invention relates to a capo that is an article for use in pitch adjustment when performing a stringed instrument such as a guitar.

2. Description of the Related Art

A capo is for use in pressing desired positions of all strings of a stringed instrument such as a guitar. In case of accompanying a song on the stringed instrument, the positions to be pressed with the capo are changed in accordance with a tune or a singing range of a singer. On stage, however, it is necessary to rapidly operate the capo without making any sound, between tunes and so on.

Conventional capos include, for example, a type of capo that holds a neck of the stringed instrument to press all strings by use of spring force. Furthermore, there are other types of capos such as a capo which is tightened with grip strength to hold the neck with frictional force (e.g., see International Publication No. WO 2009/115461, hereinafter referred to as "PTL 1") and a capo which utilizes leverage (e.g., see International Publication No. WO 98/49669 and Japanese Patent Application Laid-Open No. 2010-145998, hereinafter respectively referred to as "PTL 2" and "PTL 3").

CITATION LIST

Patent Literature 1: International Publication No. WO 2009/115461
Patent Literature 2: International Publication No. WO 98/49669
Patent Literature 3: Japanese Patent Application Laid-Open No. 2010-145998

SUMMARY OF THE INVENTION

However, when a type of capo which uses a spring or friction to hold the neck is attached, strong grip strength is required. It is difficult especially for a player with insufficient grip strength to rapidly operate the capo, for example, between performances. Furthermore, a type of capo which utilizes leverage can be operated with light force. However, it is required to adjust beforehand in accordance with the stringed instrument, and is difficult to adjust the capo so as to be usable for a plurality of stringed instruments at once.

The present invention has been made in view of such situations, and aims to provide a capo that can be operated simply and reliably even by a player with insufficient grip strength.

To achieve the above object, provided are aspects of the present invention as follows.

A capo according to a first aspect of the present invention is a capo which is to be fixed onto a neck of a stringed instrument, including: a pair of arm members (a pair of arm) configured to hold the neck therebetween; and an electric drive mechanism (electric driver) configured to change a distance between the pair of arm members.

According to a second aspect of the present invention, in the capo according to the first aspect, one arm member of the pair of arm members is a movable arm member, and the other arm member is a non-movable arm member, and the electric drive mechanism includes: a motor configured to generate a drive force; and a drive force transmission member configured to transmit the drive force generated by the motor to the movable arm member.

According to a third aspect of the present invention, in the capo according to the second aspect, the drive force transmission member (drive force transmission) is a lead screw to be rotated by the motor, and the movable arm member includes a screw part (screw-formed part) having a screw hole into which the lead screw is screwed, and the movable arm member is configured to be movable in an axial direction of the lead screw by rotation of the lead screw.

According to a fourth aspect of the present invention, in the capo according to the second aspect, the drive force transmission member is a worm gear including: a worm coupled to an output shaft of the motor; and a worm wheel configured to mesh with the worm, and the movable arm member is coupled and fixed to the worm wheel.

According to a fifth aspect of the present invention, the capo according to any one aspect of the second aspect to the fourth aspect, includes: a voltmeter configured to measure a voltage applied to the motor; and a first motor controller configured to permit bidirectional rotation of the motor in a case where the voltage is more than or equal to a first threshold, and configured to permit only unidirectional rotation of the motor in a case where the voltage is less than the first threshold.

According to a sixth aspect of the present invention, the capo according to any one aspect of the second aspect to the fifth aspect, includes: an ammeter configured to measure a current flowing through the motor, and a second motor controller configured to prohibit rotation of the motor in a case where the current is more than or equal to a second threshold, and configured to permit the rotation of the motor in a case where the current is less than the second threshold.

According to the present invention, a distance between a pair of arm members can be adjusted easily and simply by an electric drive mechanism, and hence a player with insufficient grip strength can also operate simply and reliably.

DESCRIPTION OF EMBODIMENTS

Hereinafter, description will be made as to preferable embodiments according to the present invention in detail with reference to the accompanying drawings.

First Embodiment

Figure 1:
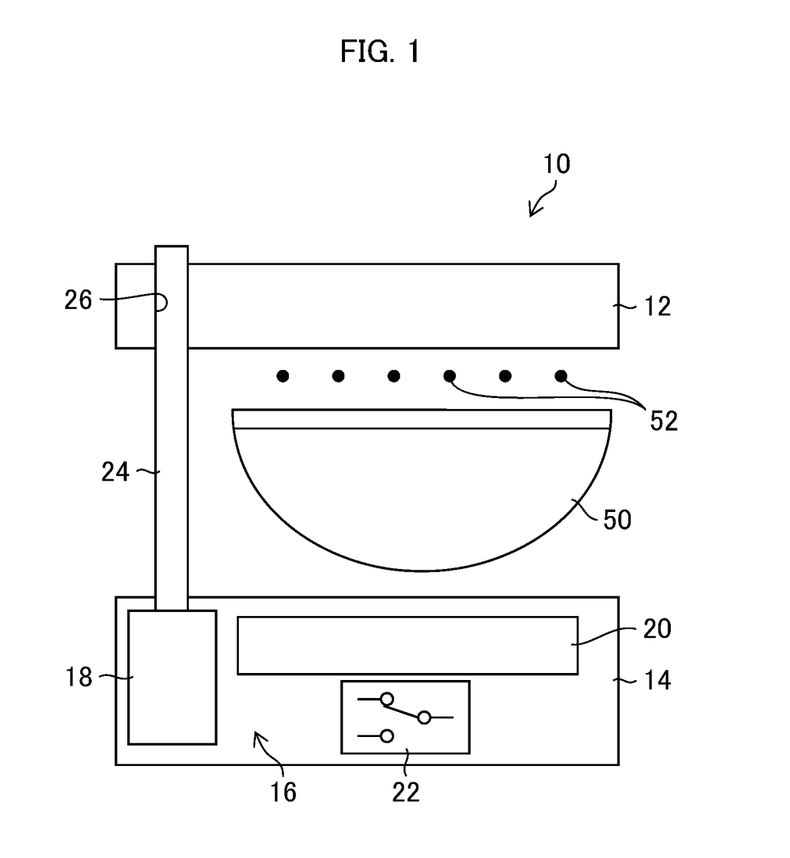
FIG. 1 is a schematic view showing a configuration of a capo according to a first embodiment.

FIG. 1 is a schematic view showing a configuration of a capo 10 according to a first embodiment. As shown in FIG. 1, the capo 10 of the present embodiment includes a first arm member 12 and a second arm member 14 disposed opposite to each other, as a pair of arm members capable of holding a neck 50 of a stringed instrument therebetween. The first arm member 12 is disposed on a front surface side (a side where strings 52 are disposed) of the neck 50. The second arm member 14 is disposed on a back surface side (a side opposite to the side where the strings 52 are disposed) of the neck 50.

The capo 10 according to the present embodiment further includes an electric drive mechanism 16 configured to change a distance (space) between the first arm member 12 and the second arm member 14. The electric drive mechanism 16 includes a motor 18 that is a drive source, and causes the first arm member 12 to move closer to or away from the second arm member 14 (an opening/closing operation) by use of a drive force generated by the motor 18, so as to change the distance between the first arm member 12 and the second arm member 14.

The motor 18 is fixed to the second arm member 14 that is a non-movable arm member, and generates the drive force to move the first arm member 12 relative to the second arm member 14. The motor 18 is an electric motor that is capable of bidirectionally rotating its output shaft (a rotary shaft).

The motor 18 is electrically connected to a battery 20 and an operation unit 22 that are provided in the second arm member 14. The operation unit 22 includes a plurality of switches 28A to 28D (see FIG. 2) as described later. In response to an operation state (an on/off state) of each of these switches 28A to 28D, a current is supplied from the battery 20 to the motor 18. Consequently, the motor 18 generates the drive force depending on the current supplied from the battery 20.

Furthermore, the electric drive mechanism 16 includes a lead screw 24 that transmits, to the first arm member 12, the drive force generated by the motor 18. The lead screw 24 is an example of a drive force transmission member of the present invention.

The lead screw 24 is coupled to the output shaft of the motor 18, and rotates integrally with the output shaft of the motor 18. On a surface (a circumferential surface) of the lead screw 24, a screw thread (an external thread) is formed.

The first arm member 12 includes a screw part (a nut part) 26 having a screw hole (an internal thread) into which the lead screw 24 is screwed, and is configured to be movable in an axial direction of the lead screw 24 by rotation of the lead screw 24. Note that to convert the rotation of the lead screw 24 to linear movement of the first arm member 12, the capo 10 is provided with a rotation regulating unit (not shown) that regulates rotation of the first arm member 12 in rotating the lead screw 24.

According to such a configuration, when the lead screw 24 is rotated by the drive force generated by the motor 18, the first arm member 12 moves in the axial direction of the lead screw 24. That is, depending on a rotating direction of the screw, the first arm member 12 performs the opening/closing operation of moving on a direction approaching the second arm member 14 (a downward direction of FIG. 1) or a direction separating from the second arm member 14 (an upward direction of FIG. 1).

Figure 2:
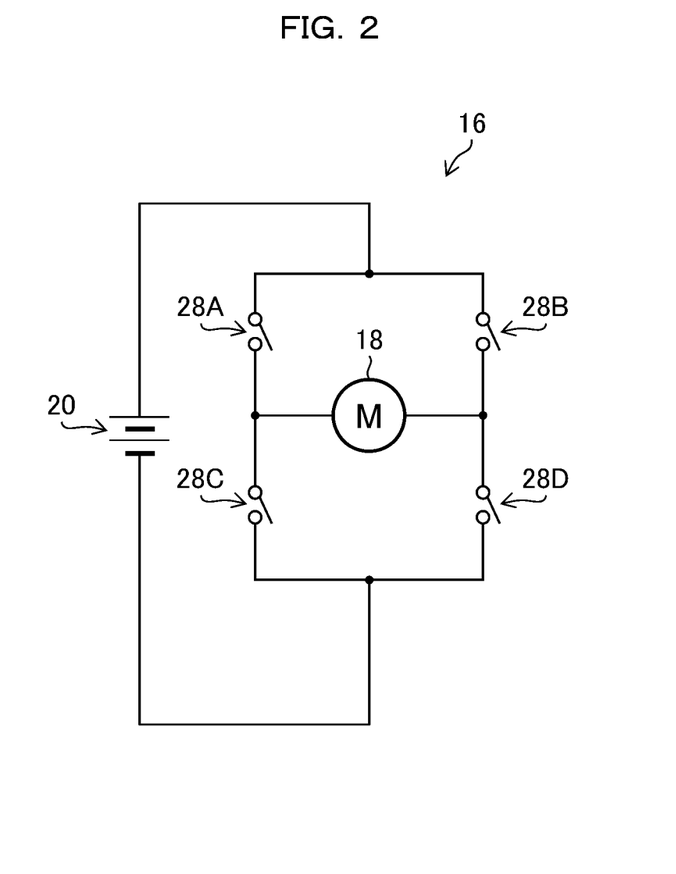
FIG. 2 is a circuit diagram showing an electric configuration of an electric drive mechanism of the capo according to the first embodiment.

FIG. 2 is a circuit diagram showing an electric configuration of the electric drive mechanism 16 of the capo 10 according to the first embodiment.

As shown in FIG. 2, the electric drive mechanism 16 of the capo 10 according to the present embodiment includes the plurality of switches 28A to 28D as components of the operation unit 22 described above (see FIG. 1). The electric drive mechanism 16 is formed as a general H-bridge circuit by the plurality of switches 28A to 28D, and controls increase/decrease of the current that flows through a coil of the motor 18 in accordance with any combination of the on/off states of the respective switches 28A to 28D. Note that each of the switches 28A to 28D may be a mechanical contact switch or a semiconductor switch.

There are three modes of control of the current that flows through the coil of the motor 18. That is, when a first switch 28A and a fourth switch 28D are turned on among the respective switches 28A to 28D, the control mode turns to a forward rotation mode where the motor 18 rotates forward. Furthermore, when a second switch 28B and a third switch 28C are turned on, the control mode turns to a reverse rotation mode where the motor 18 rotates in reverse. Alternatively, when the first switch 28A and the second switch 28B are turned on or the third switch 28C and the fourth switch 28D are turned on, the control mode turns to a stop mode where a braking brake of the motor 18 is operated.

Next, an operation in attaching the capo 10 according to the present embodiment to the neck 50 will be described.

First, in a case where the distance between the first arm member 12 and the second arm member 14 decreases, the second switch 28B and the third switch 28C are turned on by an operation of the operation unit 22, and the motor 18 is driven in the reverse rotation mode to broaden the distance between the first arm member 12 and the second arm member 14. Consequently, the capo 10 is placed in an open state so that the capo can be attached to the neck 50.

Next, in a case where the capo 10 is attached to the neck 50, in order to fix the capo 10 at a desired pitch position, the capo 10 is positioned with the neck 50 in a state where the neck 50 and the strings 52 are disposed between the first arm member 12 and the second arm member 14.

Next, the operation unit 22 is operated to turn on the first switch 28A and the fourth switch 28D, and the motor 18 is driven in the forward rotation mode to gradually decrease the distance between the first arm member 12 and the second arm member 14. Consequently, the neck 50 and the strings 52 are held (sandwiched) between the first arm member 12 and the second arm member 14, and the capo 10 is in a fixed state where the capo 10 is unremovably fixed to the neck 50.

Consequently, when the capo 10 is attached to the neck 50 (i.e., in the above fixed state), the operation unit 22 is preferably operated to turn on the first switch 28A and the second switch 28B or turn on the third switch 28C and the fourth switch 28D in order to set the motor 18 in the stop mode. In such a state, the braking brake of the motor 18 is operated. to keep the distance between the first arm member 12 and the second arm member 14. According to this aspect, the capo 10 attached to the neck 50 can be prevented from being loosened during performance with the stringed instrument.

Note that to remove the capo 10 according to the present embodiment from the neck 50, the operation unit 22 is operated to turn on the second switch 28B and the third switch 28C in order to drive the motor 18 in the reverse rotation mode and broaden the distance between the first arm member 12 and the second arm member 14. Consequently, the capo 10 can be easily removed from the neck 50.

As above, according to the first embodiment, the electric drive mechanism 16 can easily and simply adjust the distance between the first arm member 12 and the second arm member 14. The electric drive mechanism 16 can selectively switch the capo 10 between the fixed state where the capo 10 is fixed to be unremovable from the neck 50 and the open state where the capo 10 is attachable to and removable from the neck 50. Therefore, even a player with insufficient grip strength can operate simply and reliably.

Note that in the explanation about the configuration of the first embodiment, the first arm member 12 is a movable arm member and the second arm member 14 is a non-movable arm member, but these members may be configured in reverse.

Furthermore, in the first embodiment, the capo 10 is configured to be able to open and close by the electric operation, but the capo 10 may be configured to be able to open and close by a manual operation, in addition to the electric operation.

Figure 3:
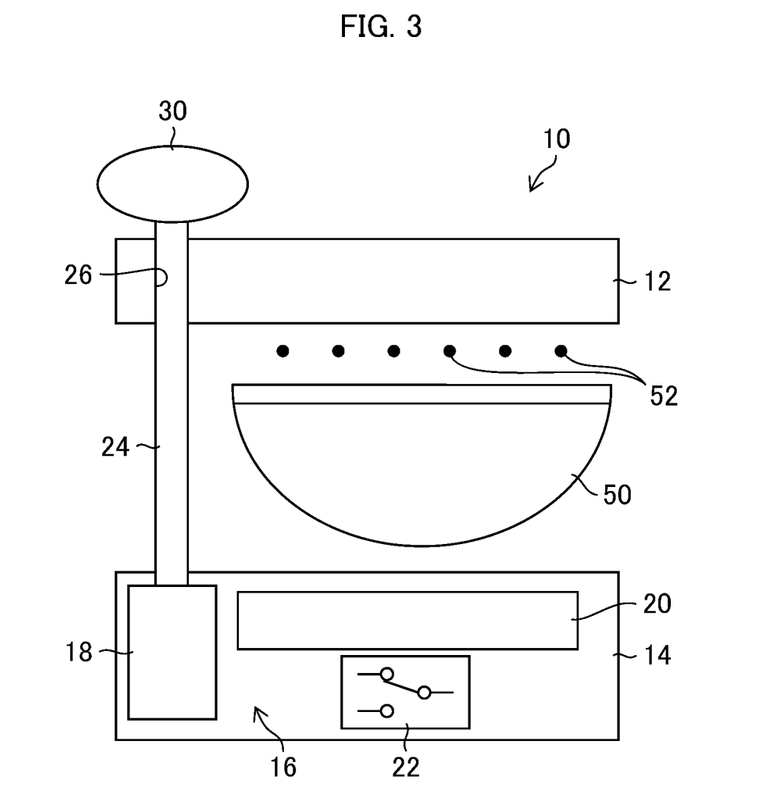
FIG. 3 is a schematic view showing a modification of the configuration of the capo according to the first embodiment.

FIG. 3 is a schematic view showing a modification of the configuration of the capo 10 according to the first embodiment. In the modification shown in FIG. 3, the capo 10 further includes a knob 30 that is a manual operation member, in addition to the configuration shown in FIG. 1. The knob 30 is attached to a tip of the lead screw 24. Further, the knob 30 may be detachably attached to the lead screw 24. Consequently, even in case of battery exhaustion, the knob 30 attached to the tip of the lead screw 24 can be operated to rotate so that the lead screw 24 can be rotated. Thus, it is possible to perform the opening/closing operation of changing the distance between the first arm member 12 and the second arm member 14. Therefore, even in a case where the battery 20 is exhausted in a state where capo 10 is attached to the neck 50 of the stringed instrument, the capo 10 is removable from the neck 50. Furthermore, if a tightening force of the capo 10 to the neck 50 is insufficient, the capo 10 can be tightened with a manual operation by use of the knob 30.

Note that the present invention is not limited to the configuration where the manual operation is performed by use of the knob 30. The manual operation may be performed using a general tool such as a driver or a hexagonal wrench.

Second Embodiment

Next, description will be made as to a second embodiment according to the present invention. Hereinafter, description of parts common to that of the first embodiment is omitted, and characteristic parts of the present embodiment will be mainly described.

The second embodiment is similar to the first embodiment except a different electric configuration of the capo 10.

Figure 4:
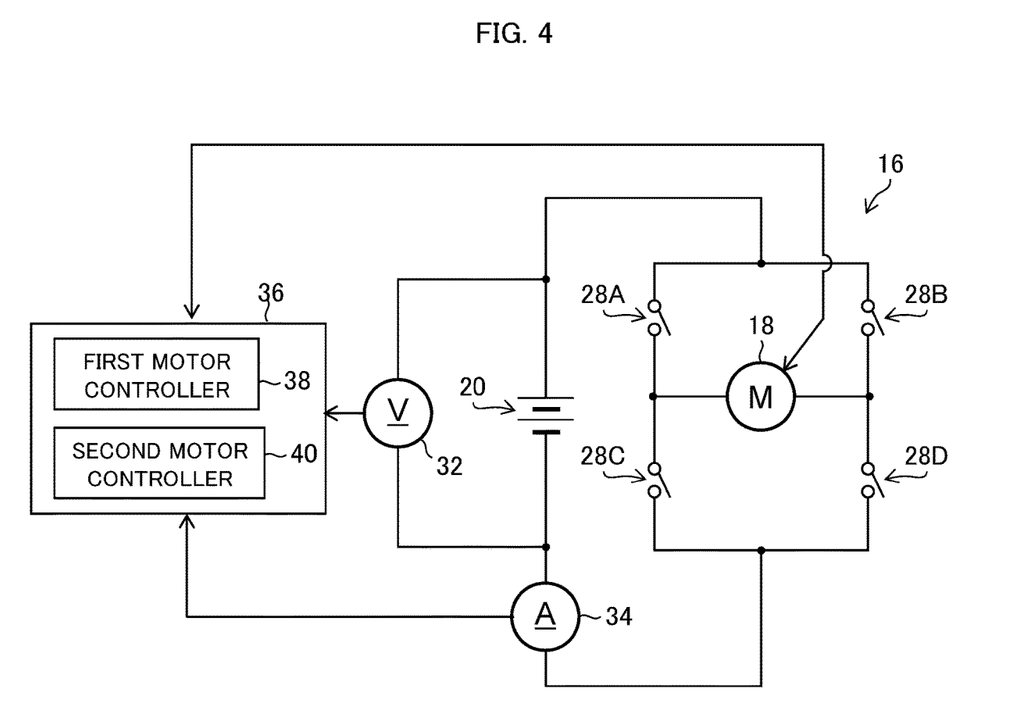
FIG. 4 is a diagram showing an electric configuration of an electric drive mechanism of a capo according to a second embodiment.

FIG. 4 is a circuit diagram showing an electric configuration of an electric drive mechanism 16 of the capo 10 according to the second embodiment. Here, in FIG. 4, a component common or similar to that of FIG. 2 is denoted with the same reference number.

As shown in FIG. 4, the electric drive mechanism 16 in the second embodiment further includes a voltmeter 32, an ammeter 34, and a microcomputer 36, in addition to the configuration of the first embodiment.

The voltmeter 32 measures a voltage (a power supply voltage) to be applied to a motor 18. The voltage measured by the voltmeter 32 is output to the microcomputer 36. Note that accurately, the output of the voltmeter 32 is converted to a digital signal by an A/D converter or the like, and then output to the microcomputer 36.

The ammeter 34 measures a current (a load current) to be supplied to the motor 18. The current measured by the ammeter 34 is output to the microcomputer 36. Note that accurately, the output of the ammeter 34 is converted to a voltage value at a shunt resistance or the like, converted to a digital signal by the A/D converter or the like, and output to the microcomputer 36.

The microcomputer 36 includes a known configuration including a CPU, a ROM, a RAM, an input/output interface and others. The microcomputer 36 is connected to the voltmeter 32, the ammeter 34, and the motor 18. According to computer program stored in the ROM, the microcomputer functions as a first motor controller 38 that controls an operation of the motor 18 depending on the voltage measured by the voltmeter 32, and functions as a second motor controller 40 that controls the operation of the motor 18 depending on the current measured by the ammeter 34.

The first motor controller 38 determines whether the voltage measured by the voltmeter 32 is more than or equal to a preset first threshold. The first threshold may be held in storage device such as the RAM. The first threshold may be a value obtained by multiplying a maximum voltage value of a battery 20 by a predetermined coefficient (e.g., from 0.1 to 0.3).

In a case where it is determined that the voltage measured by the voltmeter 32 is more than or equal to the first threshold, the first motor controller 38 determines that the battery 20 has a sufficient remaining amount of power, and permits operations of the motor 18 both in the forward rotation mode and in the reverse rotation mode. That is, the first motor controller 38 permits bidirectional rotation of the motor 18, and enables both an opening operation of moving the first arm member 12 apart from the second arm member 14 and a closing operation of moving the first arm member 12 closer to the second arm member, as the opening and closing operations of the first arm member 12 and the second arm member 14 of the capo 10.

On the other hand, if the voltage measured by the voltmeter 32 is less than the first threshold, the first motor controller 38 determines that the battery 20 only has a small remaining amount of power, and permits only the operation of the motor 18 in the reverse rotation mode. That is, the first motor controller 38 permits only unidirectional rotation of the motor 18, and enables only the opening operation of moving the first arm member 12 apart from the second arm member 14, in the opening and closing operations of the first arm member 12 and the second arm member 14 of the capo 10. The first motor controller 38 does not permit the closing operation of moving the first arm member 12 closer to the second arm member 14.

The second motor controller 40 determines whether the current measured by the ammeter 34 is more than or equal to a preset second threshold. The second threshold may be held in storage device such as the RAM. The second threshold may be a value obtained by multiplying a maximum load current value of the motor 18 by a predetermined coefficient (e.g., from 0.8 to 0.9).

In a case where it is determined that the current measured by the ammeter 34 is less than the second threshold, the second motor controller 40 determines that the current to be supplied to the motor 18 is in a normal range, and permits rotation of the motor 18. On the other hand, if the current measured by the ammeter 34 is more than or equal to the second threshold, the second motor controller 40 determines that the current to be supplied to the motor 18 is excessively beyond the normal range, and prohibits the rotation of the motor 18 to stop the operation of the motor 18. Furthermore, in a case where the capo 10 moves in an open direction (a direction in which the first arm member 12 and the second arm member 14 move apart from each other), it is also possible to automatically stop the motor 18 at an open limit.

As above, according to the second embodiment, in a case where the battery 20 has the small remaining amount of power, the motor 18 is controlled so as to move only in the direction in which the capo 10 opens. Consequently, the battery 20 can be prevented from being exhausted in a state where the capo 10 is attached to a neck 50 of a stringed instrument, and the capo 10 can be prevented from becoming unremovable from the neck 50.

Furthermore, according to the second embodiment, in a case where the load current of the motor 18 is excessively large, the operation of the motor 18 is stopped. Consequently, when the capo 10 is attached to the neck 50, the neck 50 held between the first arm member 12 and the second arm member 14 is not tightened with an excessively large force. Therefore, the neck 50 can be prevented from being damaged, and the player's hand or the like can be prevented from being caught.

Note that in the second embodiment, explanation is made for the configuration where the operation of the motor 18 is controlled by using the microcomputer 36, but the present invention is not limited to this configuration. The cap 10 can be configured such that, for example, a comparator or the like is used in place of the microcomputer 36.

Third Embodiment

Next, description will be made as to a third embodiment according to the present invention. Hereinafter, description of parts common to that of each of the above described embodiments is omitted, and characteristic parts of the present embodiment will be mainly described.

The third embodiment is similar to the first embodiment except a different mechanical configuration of the capo 10.

Figure 5:
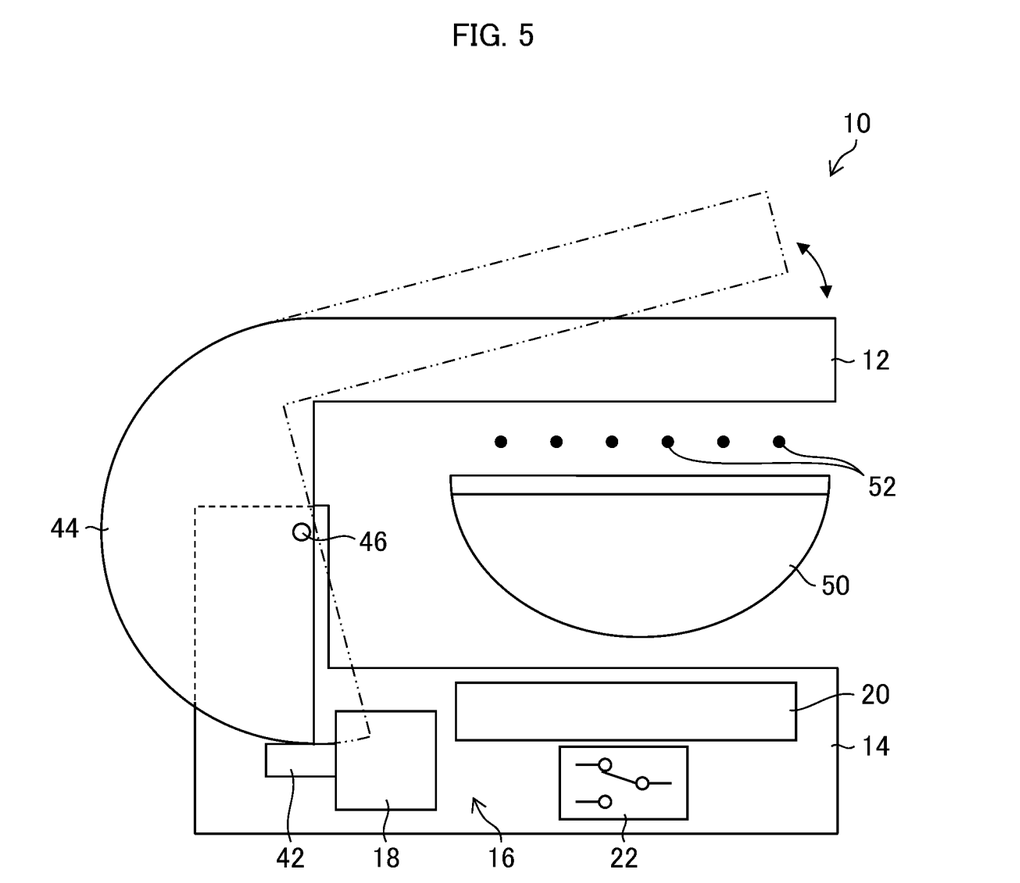
FIG. 5 is a schematic view showing a configuration of a capo according to a third embodiment.

FIG. 5 is a schematic view showing a configuration of the capo 10 according to the third embodiment. Here, in FIG. 5, components common or similar to that of FIG. 1 are denoted with the same reference numbers.

As shown in FIG. 5, the capo 10 according to the third embodiment includes a worm gear (a reduction mechanism) having a worm 42 and a worm wheel 44. The worm gear is an example of a drive force transmission member according to the present invention.

The worm 42 is a screw-like gear having a spiral groove formed in a circumferential surface thereof. The worm 42 is coupled to the output shaft of the motor 18, and rotates integrally with the output shaft of the motor 18.

The worm wheel 44 is a semicircular worm wheel (a bevel gear) configured to mesh with the worm 42. The worm wheel 44 is supported by the second arm member 14 so as to be rotatable about (around) a wheel shaft 46. Furthermore, the first arm member 12 is coupled and fixed to the worm wheel 44.

With the configuration, when the worm 42 is rotated by a drive force generated by the motor 18, the worm wheel 44 which is rotatably supported by the second arm member 14 rotates about the wheel shaft 46 according to a rotating direction of the worm 42. Consequently, the first arm member 12 rotates integrally with the worm wheel 44 about the wheel shaft 46. Therefore, the first arm member 12 performs the opening/closing operation of moving in a direction approaching to the second arm member 14 or a direction separating from the second arm member 14.

Therefore, according to the third embodiment, similarly to the above described first embodiment, the electric drive mechanism 16 can easily and simply adjust the distance between the first arm member 12 and the second arm member 14, and can selectively switch the capo 10 between the fixed state where the capo 10 is unremovably fixed to the neck 50 and the open state where the capo 10 is attachable to and removable from the neck 50.

Furthermore, according to the third embodiment, the distance between the first arm member 12 and the second arm member 14 can be kept (maintained) by a self-lock (automatic tightening) function of the worm gear having the worm 42 and the worm wheel 44 without using a braking brake of the motor 18.

Note that in the third embodiment, the explanation is made for the configuration provided with the worm gear having the worm 42 and the worm wheel 44 as the drive force transmission member, but the present invention is not limited to this configuration. The capo 10 may be configured to include various types of gears.

Additionally, needless to say, as an electric configuration of the capo 10 in the third embodiment, a configuration similar to that of the first embodiment or the second embodiment is applicable.

Furthermore, in the third embodiment, the capo 10 is configured to be openable and closable by an electric operation, but similarly to the modification of the first embodiment, the capo 10 may be further configured to be openable and closable by a manual operation in addition to the electric operation.

Figure 6:
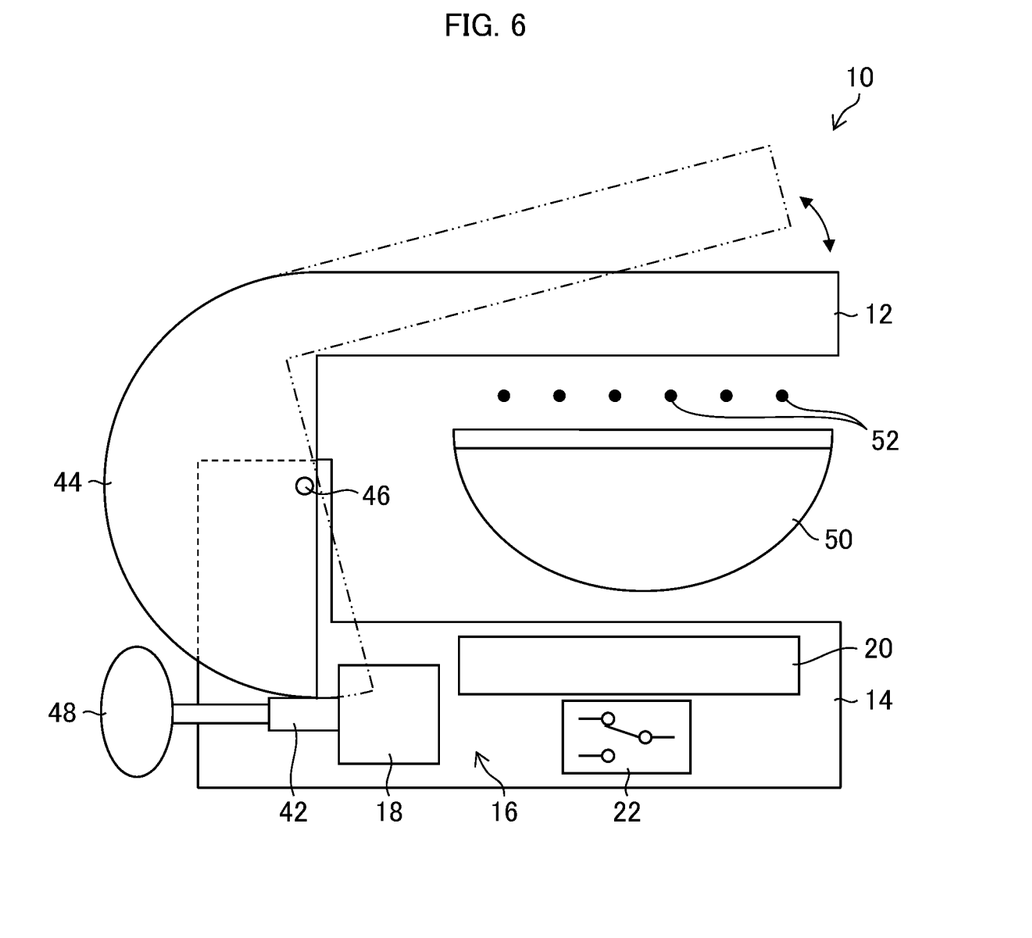
FIG. 6 is a schematic view showing a modification of the configuration of the capo according to the third embodiment.

FIG. 6 is a schematic view showing a modification of the configuration of the capo 10 according to the third embodiment. In the modification shown in FIG. 6, the capo further includes a knob 48 that is a manual operation member, in addition to the configuration shown in FIG. 5. The knob 48 is attached to a tip of the worm 42. The knob 48 may be detachably attached to and removed from the worm 42. Consequently, similarly to the modification of the first embodiment, even in case of battery exhaustion, the knob 48 attached to the tip of the worm 42 is operated to rotate so that the worm 42 is rotated. Thereby, it is possible to perform the opening/closing operation of changing the distance between the first arm member 12 and the second arm member. Therefore, even in a case where the battery 20 is exhausted in a capo 10 attached to a neck 50 of a stringed instrument, the capo 10 can be removed from the neck 50. Furthermore, if the tightening force of the capo 10 to the neck 50 is insufficient, the knob 48 is manually operated so that the capo 10 can be tightened.

Note that in each of the above described embodiments, explanation is made for the configuration having the motor 18, as the electric drive mechanism 16 of the capo 10. However, the present invention is not limited to the configuration. For example, the capo 10 may be configured to include a piezoelectric actuator or an artificial muscle actuator that expands and contracts by applying the voltage.

Figure 7:
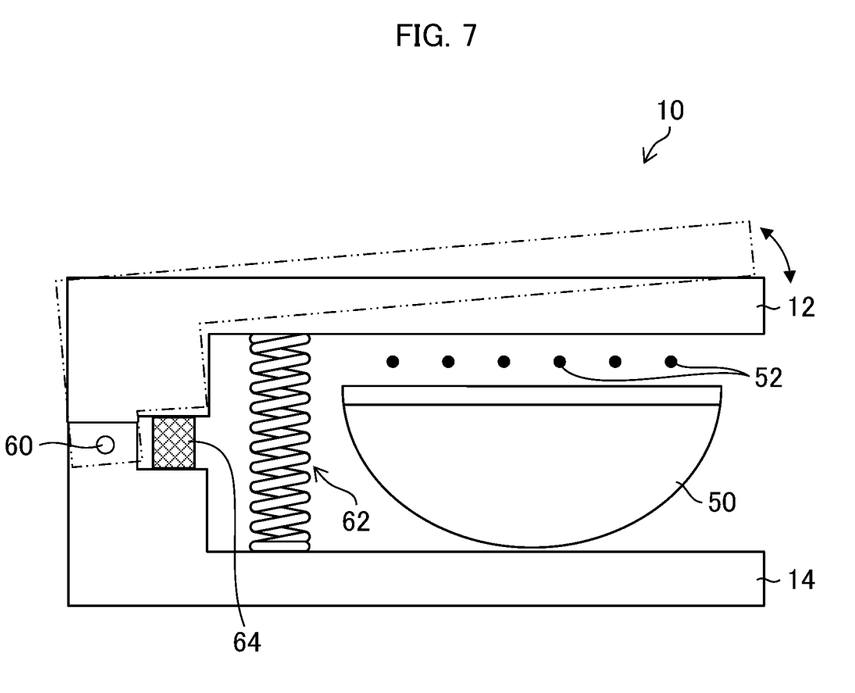
FIG. 7 is a schematic view showing a configuration example where a piezoelectric actuator is used as the electric drive mechanism of the capo.

FIG. 7 is a schematic view showing a configuration example where a piezoelectric actuator 64 is used as the electric drive mechanism 16 of the capo 10. Here, in FIG. 7, components common or similar to that of FIG. 1 or FIG. 5 are denoted with the same reference numbers.

In the configuration example shown in FIG. 7, the first arm member 12 and the second arm member 14 form a pair of arm members, and can hold the neck 50 of a stringed instrument therebetween. The first arm member 12 and the second arm member 14 respectively have shaft holes, and a rotary shaft 60 such as a pin is inserted into the shaft holes so that the first arm member 12 and the second arm member 14 are rotatably coupled to each other.

An urging member 62 such as a spring is provided between the first arm member 12 and the second arm member 14. The urging member 62 has two ends that are respectively fixed to the first arm member 12 and the second arm member 14, to generate an urging force in a direction in which the first arm member 12 and the second arm member 14 are urged to move close to each other. Consequently, in a case where the piezoelectric actuator 64 described later is not driven, the urging force of the urging member 62 always urges the first arm member 12 and the second arm member 14 to a state where the first arm member 12 and the second arm member 14 are approaching to each other (i.e., the state corresponding to the fixed state above). Therefore, the urging force of the urging member 62 is suitably adjusted so as to adjust a force to press the strings 52 against the neck 50 of the stringed instrument. In consequence, a tone obtained when the capo 10 is attached to the neck 50 of the stringed instrument can be adjusted with the urging force of the urging member 62.

Furthermore, in the configuration example shown in FIG. 7, the piezoelectric actuator 64 is disposed between the first arm member 12 and the second arm member 14, more specifically at a position closer to the rotary shaft 60 than to the urging member 62 (preferably a position near the rotary shaft 60). The piezoelectric actuator 64 is an actuator that is stretched (stretched in a vertical direction in FIG. 7) by applying a voltage. Therefore, when the voltage is applied to the piezoelectric actuator 64 by an actuator drive unit (not shown), the piezoelectric actuator 64 stretches, to perform an opening operation which causes the first arm member 12 and the second arm member 14 to separate from each other against the urging force of the urging member 62.

According to the configuration example shown in FIG. 7, between the opening operation and the closing operation that change the distance between the first arm member 12 and the second arm member 14, the piezoelectric actuator 64 is driven only when the opening operation is performed. Therefore, power consumption can be suppressed.

Furthermore, according to the configuration example shown in FIG. 7, the piezoelectric actuator 64 is disposed closer to the rotary shaft 60 than to the urging member 62. Consequently, even in a case where the piezoelectric actuator 64 has a small stretching rate (expansion/contraction rate), it is possible to broaden a drive range (an opening/closing range) of the first arm member 12 and the second arm member 14, using the principle of leverage.

Figure 8:
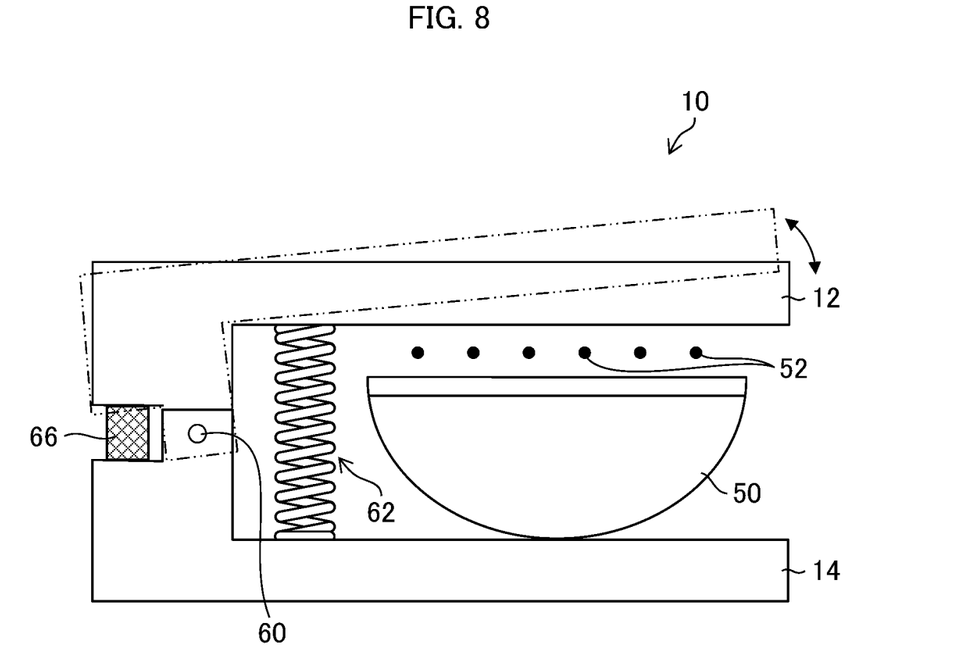
FIG. 8 is a schematic view showing a configuration example where an artificial muscle actuator is used as the electric drive mechanism of the capo.

FIG. 8 is a schematic view showing a configuration example where an artificial muscle actuator 66 is used as an electric drive mechanism 16 of the capo 10. Here, in FIG. 8, components common or similar to that of FIG. 7 are denoted with the same reference numbers.

In the configuration example shown in FIG. 8, a basic configuration is similar to that in the configuration example shown in FIG. 7, but in place of the piezoelectric actuator 64 (e.g., see FIG. 7), the artificial muscle actuator 66 is provided. Note that the urging member 62 generates an urging force in a direction in which a first arm member 12 and a second arm member 14 are moved close to each other in the same manner as in the configuration example shown in FIG. 7.

The artificial muscle actuator 66 is an actuator contracted (contracted in the vertical direction in FIG. 8) by applying a voltage. The artificial muscle actuator 66 is common to the piezoelectric actuator 64 shown in FIG. 7 in that the artificial muscle actuator 66 is disposed between the first arm member 12 and the second arm member 14. However, the artificial muscle actuator 66 is different in that the artificial muscle actuator 66 is disposed at a position not on the same side as an urging member 62 relative to the rotary shaft 60, but on a side opposite to the urging member relative to the rotary shaft 60.

Therefore, according to the configuration example shown in FIG. 8, in a case where the voltage is applied to the artificial muscle actuator 66 by an unshown actuator drive unit, the artificial muscle actuator 66 contracts so as to perform the opening operation of causing the first arm member 12 and the second arm member 14 to move away from each other against the urging force of the urging member 62.

Furthermore, it is preferable that a distance between the artificial muscle actuator 66 and the rotary shaft 60 is shorter than a distance between the urging member 62 and the rotary shaft 60. According to this configuration, in the same manner as in the configuration example shown in FIG. 7, even in a case where the artificial muscle actuator 66 has a small ratio of expansion and contraction, it is possible to broaden a drive range (an opening/closing range) of the first arm member 12 and the second arm member 14 with a principle of leverage.

Note that in the respective configuration examples shown in FIG. 7 and FIG. 8, it is also possible to configure the capo 10 such that the piezoelectric actuator 64 is replaced with the artificial muscle actuator 66 and an urging direction of the urging member 62 is reversed (i.e., a direction of moving the first arm member 12 and the second arm member 14 away from each other). In this case, however, the configuration is disadvantageous in terms of power consumption because a force to hold the neck 50 between the first arm member 12 and the second arm member 14 is applied with the actuator (the piezoelectric actuator 64 or the artificial muscle actuator 66). Consequently, the configuration where the urging member 62 urges the first arm member 12 and the second arm member 14 in a direction approaching to each other is preferable as in the configuration examples shown in FIG. 7 and FIG. 8.

Furthermore, in the respective configuration examples shown in FIG. 7 and FIG. 8, an aspect where the spring is used as the urging member 62 has been described, but the present invention is not limited to these examples. For example, a rubber or the like may be used.

As above, the embodiments of the present invention have been described, but the present invention is not limited to the above examples. Needless to say, various improvements and modifications may be performed without departing from gist according to the present invention.

REFERENCE SIGNS LIST

10 . . . capo, 12 . . . first arm member, 14 . . . second arm member, 16 . . . electric drive mechanism, 18 . . . motor, 20 . . . battery, 22 . . . operation unit, 24 . . . lead screw, 26 . . . screw part, 28A to 28D . . . switch, 30 . . . knob, 32 . . . voltmeter, 34 . . . ammeter, 36 . . . microcomputer, 38 . . . first motor controller, 40 . . . second motor controller, 42 . . . worm, 44 . . . worm wheel, 46 . . . wheel shaft, 48 . . . knob, 50 . . . neck, 52 . . . string, 60 . . . rotary shaft, 62 . . . urging member, 64 . . . piezoelectric actuator, and 66 . . . artificial muscle actuator.

What is claimed is:

1. A capo which is to be fixed onto a neck of a stringed instrument, comprising:
    a pair of arms configured to hold the neck therebetween; and
    an electric driver configured to change a distance between the pair of arms.

2. The capo according to claim 1, wherein
    one arm of the pair of arms is a movable arm, and the other arm is a non-movable arm, and
    the electric driver comprises:
    a motor configured to generate a drive force; and
    a drive force transmission configured to transmit the drive force generated by the motor to the movable arm.

3. The capo according to claim 2, wherein
    the drive force transmission is a lead screw to be rotated by the motor, and
    the movable arm includes a screw-formed part having a screw hole into which the lead screw is screwed, and the movable arm is configured to be movable in an axial direction of the lead screw by rotation of the lead screw.

4. The capo according to claim 2, wherein
    the drive force transmission is a worm gear comprising: a worm coupled to an output shaft of the motor; and a worm wheel configured to mesh with the worm, and
    the movable arm is coupled and fixed to the worm wheel.

5. The capo according to claim 4, wherein,
    in a side view, the worm wheel has a semicircular shape,
    the movable arm is coupled and fixed with one end side of the worm wheel, and
    the worm is configured to the other end side of the worm wheel.

6. The capo according to claim 2, comprising:
    a voltmeter configured to measure a voltage applied to the motor; and
    a first motor controller configured to permit bidirectional rotation of the motor in a case where the voltage is more than or equal to a first threshold, and configured to permit only unidirectional rotation of the motor in a case where the voltage is less than the first threshold.

7. The capo according to claim 2, comprising:
    an ammeter configured to measure a current flowing through the motor; and
    a second motor controller configured to prohibit rotation of the motor in a case where the current is more than or equal to a second threshold, and configured to permit the rotation of the motor in a case where the current is less than the second threshold.

* * * * *